(12) United States Patent
Sheedy et al.

(10) Patent No.: US 12,269,779 B2
(45) Date of Patent: Apr. 8, 2025

(54) METHOD FOR PRODUCING A CERAMIC MATRIX COMPOSITE COMPONENT

(71) Applicant: United Technologies Corporation, Farmington, CT (US)

(72) Inventors: Paul Sheedy, Bolton, CT (US); Neal Magdefrau, Tolland, CT (US); Wayde R. Schmidt, Pomfret Center, CT (US)

(73) Assignee: RTX CORPORATION, Farmington, CT (US)

( * ) Notice: Subject to any disclaimer, the term of this patent is extended or adjusted under 35 U.S.C. 154(b) by 951 days.

(21) Appl. No.: 16/239,625

(22) Filed: Jan. 4, 2019

(65) Prior Publication Data

US 2020/0216362 A1 Jul. 9, 2020

(51) Int. Cl.
| | |
|---|---|
| *C04B 35/622* | (2006.01) |
| *C01B 32/956* | (2017.01) |
| *C04B 35/515* | (2006.01) |
| *C04B 35/565* | (2006.01) |
| *C04B 35/628* | (2006.01) |
| *C23C 16/04* | (2006.01) |

(Continued)

(52) U.S. Cl.
CPC ...... *C04B 35/62222* (2013.01); *C04B 35/515* (2013.01); *C04B 35/565* (2013.01); *C04B 35/62231* (2013.01); *C04B 35/62868* (2013.01); *C23C 16/045* (2013.01); *C23C 16/45527* (2013.01); *C23C 16/45544* (2013.01); *C23C 16/45553* (2013.01); *C23C 16/45555* (2013.01); *H01L 21/02529* (2013.01); *C01B 32/956* (2017.08); *C04B 2235/614* (2013.01)

(58) Field of Classification Search
CPC ............ C04B 35/62222; C04B 35/565; C04B 35/62868; C04B 35/515; C04B 35/62231; C04B 2235/614; C04B 2235/616; C04B 2235/5224; C04B 2235/5248; C04B 2235/5244; C04B 2235/524; C04B 2235/522; C04B 35/10; C04B 35/83; C04B 35/80; C23C 16/45544; C23C 16/045; C23C 16/45527; C23C 16/45553; C23C 16/45555; H01L 21/02529; C01B 32/956; B32B 18/00
USPC ............................................ 427/248.1–255.7
See application file for complete search history.

(56) References Cited

U.S. PATENT DOCUMENTS

| | | | |
|---|---|---|---|
| 5,580,643 A | * | 12/1996 | Kennedy ............... C04B 35/20 428/212 |
| 8,697,259 B2 | | 4/2014 | Ras et al. |
| 9,228,145 B2 | | 1/2016 | Scharf et al. |

(Continued)

FOREIGN PATENT DOCUMENTS

| | | | | |
|---|---|---|---|---|
| EP | 3514125 A1 | | 7/2019 | |
| GB | 2467928 A | * | 8/2010 | ........... C04B 41/009 |
| JP | 2005306625 A | | 11/2005 | |

OTHER PUBLICATIONS

EP search report for EP20150360.4 dated May 29, 2020.

*Primary Examiner* — Michael G Miller
(74) *Attorney, Agent, or Firm* — Getz Balich LLC

(57) ABSTRACT

A method of producing a ceramic matrix composite material component is provided. The method includes that steps of: a) producing a preform having one or more ceramic constituents, the preform being porous with internal voids; and b) applying at least one layer of a first material to the preform using an atomic layer deposition (ALD) process to decrease a porosity of the preform.

2 Claims, 3 Drawing Sheets

(51) Int. Cl.
    *C23C 16/455*    (2006.01)
    *H01L 21/02*    (2006.01)

(56) References Cited

U.S. PATENT DOCUMENTS

| | | |
|---|---|---|
| 9,764,989 B2 * | 9/2017 | Chamberlain ........ C23C 16/325 |
| 9,850,573 B1 | 12/2017 | Sun |
| 2015/0291473 A1 | 10/2015 | Schmidt |
| 2017/0190629 A1 | 7/2017 | Lakrout et al. |
| 2017/0342844 A1 | 11/2017 | Schmidt et al. |
| 2019/0062913 A1 | 2/2019 | She |

* cited by examiner

METHOD FOR PRODUCING A CERAMIC MATRIX COMPOSITE COMPONENT

BACKGROUND OF THE INVENTION

1. Technical Field

The present disclosure relates to methods for producing ceramic matrix composite ("CMC") components in general, and to methods for producing densified (e.g., low porosity) CMC components in particular.

2. Background Information

Ceramic matrix composites ("CMC") material may be utilized to form a variety of different components, and have particular utility in high temperature environments such as within a gas turbine engine.

In some instances, the fabrication of CMCs may involve hybrid manufacturing approaches whereby multiple processing methods may be employed. In particular, hybrid methods for processing CMCs may include certain types of chemical vapor infiltration (CVI), melt infiltration (MI), and polymer infiltration and pyrolysis (PIP) processes. In some instances, these processing methods can be used to produce a CMC component having desirable properties. However, to our knowledge none of these processing methods, individually or in combination within a hybrid approach, can be used to repeatedly produce a CMC component configured for use at an operating temperature at or above 2300° F. with low nominal porosity (e.g., less than 5% by volume).

MI processes inherently suffer from residual, low melt constituents (e.g., Si) and both CVI & PIP can be lengthy and expensive processes which still suffer from inadequate densification; e.g., inadequate densification caused by "canning off", or as evidenced by "microcracking". The term "canning off" refers to the closure of surface and/or interconnected pores within a CMC substrate before the entirety of the porosity is filled with material, thereby leaving residual void space in the CMC substrate. For example, a hybrid CVI/PIP (or MI) process for manufacturing a CMC substrate may still suffer from the inherent challenges associated with the initial CVI process, including high cost (and long times) of applying a thick CVI layer and, more critically, the propensity of a CVI process to seal off fiber tows and other regions from further densification (even from subsequent PIP or MI). Likewise, a hybrid PIP/CVI approach could incur the normal PIP detriments, including a micro-cracked matrix and may not leave a sufficient pore structure (i.e. gas permeability) to enable adequate diffusion of CVI gases into (and out of) the structure to enable further final densification. In that case, a more open, less densified (PIP) preform may be required to achieve adequate densification by CVI, which negates many of the benefits of a hybrid PIP/CVI approach (i.e. where the bulk of the densification is achieved via PIP process). In these non-limiting and other examples, the need clearly exists to provide for improved infiltration of the complex pore structure found in composite preforms.

SUMMARY

According to an aspect of the present disclosure, a method of producing a ceramic matrix composite material component is provided. The method includes that steps of: a) producing a preform having one or more ceramic constituents, the preform being porous with internal voids; and b) applying at least one layer of a first material to the preform using an atomic layer deposition (ALD) process to decrease a porosity of the preform.

According to another aspect of the present disclosure, a method of producing a ceramic matrix composite (CMC) component is provided. The method includes the steps of: a) applying at least one layer of a first material to a preform having one or more ceramic constituents, wherein the at least one layer of a first material is applied using an atomic layer deposition (ALD) process to decrease a porosity of the preform; and b) applying one or more layers of a second material to the preform after the at least one layer of the first material is applied, using a deposition process that deposits the second material in a time dependent or non-self-limiting process.

In any of the aspects or embodiments described above and herein, the method may further include applying one or more layers of a second material to the preform using a deposition process that deposits the second material in a time dependent or non-self-limiting process.

In any of the aspects or embodiments described above and herein, the deposition process that deposits the second material in a time dependent or non-self-limiting process may be at least one of a chemical vapor infiltration process, a chemical vapor deposition process, or a polymer infiltration and pyrolysis process.

In any of the aspects or embodiments described above and herein, the method may further include applying at least one layer of a third material to the preform using an ALD process to decrease the porosity of the preform.

In any of the aspects or embodiments described above and herein, the step of applying the at least one layer of the third material to the preform using an ALD process may be performed after the step of applying the one or more layers of the second material to the preform using the deposition process that deposits the second material in a time dependent or non-self-limiting process.

In any of the aspects or embodiments described above and herein, the method may further include applying at least one layer of a second material to the preform using the ALD process to decrease the porosity of the preform.

In any of the aspects or embodiments described above and herein, the first material may be the same as the second material.

In any of the aspects or embodiments described above and herein, the first material and the second material may be different from one another.

In any of the aspects or embodiments described above and herein, the ALD process may be a temporal ALD process.

In any of the aspects or embodiments described above and herein, the ALD process may be a spatial ALD process.

In any of the aspects or embodiments described above and herein, at least one of the one or more ceramic constituents may be in a fibrous form, and the fibrous form ceramic constituent may be configured as a fiber structure.

In any of the aspects or embodiments described above and herein, at least one of the one or more ceramic constituents may be fibrous and configured in one or more fibrous bundles, and the one or more fibrous bundles form at least a part of a fiber structure.

In any of the aspects or embodiments described above and herein, the one or more fibrous bundles may have an intra-bundle porosity, and the step of applying the at least one layer of the first material to the preform using the ALD process may include decreasing the intra-bundle porosity of the one or more fibrous bundles.

In any of the aspects or embodiments described above and herein, the preform may be an open-pore foam or a foam-like structure.

In any of the aspects or embodiments described above and herein, the materials applied to the preform by the ALD process may be configured to provide at least one of an increased oxidation resistance, an increased thermal expansion control, an improved moisture protection, an increased corrosion resistance, or an enhanced matrix cracking relative to the same materials applied by a process other than ALD.

DETAILED DESCRIPTION

Embodiments of the present disclosure include methods of producing a ceramic matrix composite ("CMC") component. CMC components that may be produced pursuant to the present disclosure may be a component of a gas turbine engine or other machine, but the present disclosure is not limited to CMC components designed for any particular application. The present disclosure has particular utility, however, in producing CMC components for use in high temperature applications; e.g., environments above about 2300° F.

Figure 1A:
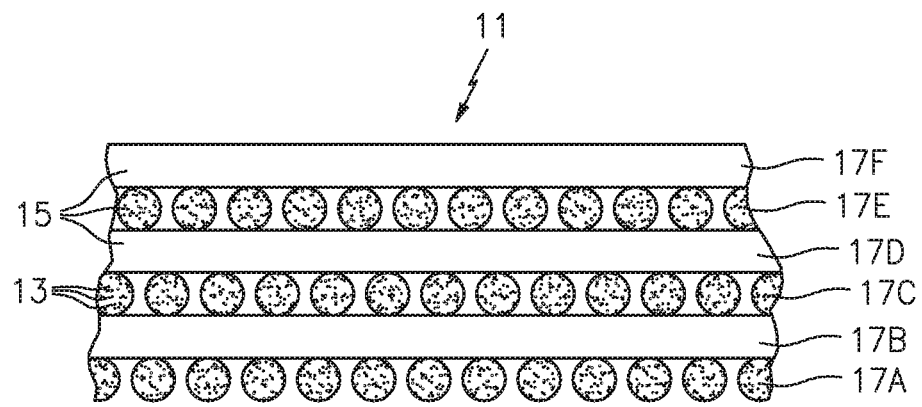
FIG. 1A is a diagrammatic representation of a multi-ply ceramic matrix composite preform without matrix material.
Figure 1B:
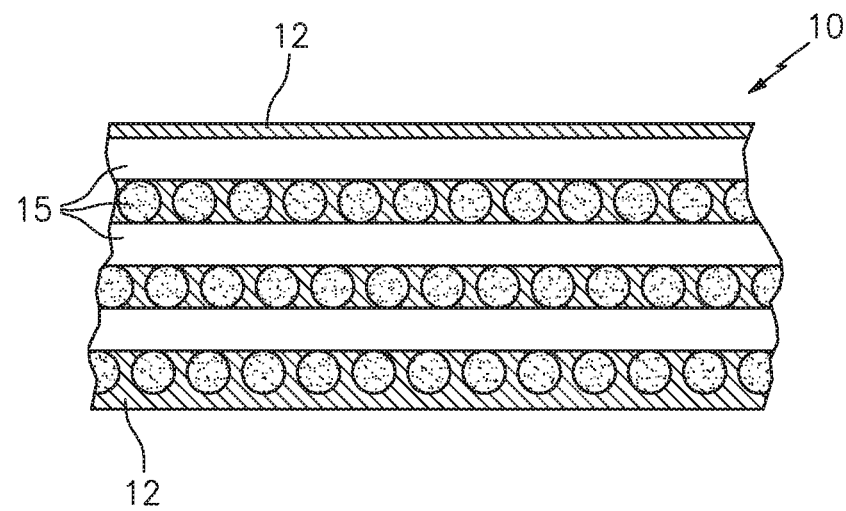
FIG. 1B is a diagrammatic representation of a multi-ply ceramic matrix composite preform with matrix material.

The manufacture of a CMC component typically begins with the production of a preform 10. The present disclosure is not limited to use with any particular preform 10; e.g., the preform 10 may be a fiber-based structure, an open-pore foam or foam-like structure, or other structures, including mixed fiber/particulate blends. FIGS. 1A and 1B diagrammatically show a preform fiber structure 11 example. Fiber structures 11 can include discontinuous or continuous fibers 13, and the continuous fibers may be arranged in woven, non-woven, braided, knitted or other known fiber architectures. The fiber structures 11 may include individual fibers 13, or fiber bundles 15 (e.g., a fiber tow), or any combination thereof. The term "fiber tow" refers to an arrangement of fibers 13 into a collective unit; e.g., a "1K" tow refers to a tow containing 1000 fibers, a "2K" tow refers to a tow containing 2000 fibers, etc. The fibers/fiber bundles 13, 15 may be arranged in a variety of different ways (e.g., the aforesaid woven, non-woven, braided, knitted, etc.). A fiber structure 11 may be arranged in plies, and the plies may be oriented relative to one another in a variety of different ways (e.g., aligned, perpendicular, angled, etc.). FIG. 1A provides a diagrammatic representation of a fiber structure 11 having a plurality of plies 17A-17F that may be used in a section of preform 10. The fiber structure 11 in FIG. 1A is depicted as including fiber bundles 15 (e.g., tows), but as stated above the fiber structure 11 may alternatively utilize unbundled fibers 13 rather than fiber bundles 15, or any combination thereof. FIG. 1A shows the fiber structure 11 without matrix material. FIG. 1B shows the same diagrammatic fiber structure 11 and further includes matrix 12 material interspersed within the fiber structure 11. The present disclosure is not limited to any particular fiber structure 11; e.g., not limited to using fibers, or fiber bundles, not limited to any fiber or fiber bundle arrangement, not limited to the number of plies, etc. A fiber bundle 15 within a fiber structure 11 may internally include void spaces that create porosity within the bundle (i.e., intra-bundle porosity), and the fibers 13 or fiber bundles 15 that form the fiber structure 11 may include void spaces between and/or around adjacent fibers or fiber bundles; i.e., inter-bundle porosity. In those fiber structures 11 that include a plurality of plies, there may be additional void spaces between plies. In some instances, a preform structure may be created by passing fibers through a slurry (e.g., a slurry that contains a polymeric binder and may include one or more types of matrix particles). The fibers may be subsequently wound on a mandrel or otherwise consolidated into a 'tape'. The tape may then be processed into desired shapes and/or orientations and stacked or "layed up" to produce a preform structure. As stated above, the present disclosure is not limited to any particular preform configuration.

The preform 10 may be subjected to steps directed to infiltrate the porosity of the preform 10. For example, in some instances, the preform 10 may be infiltrated with one or more particle types disposed within a liquid carrier. The liquid mixture is applied to the preform 10 in a manner that allows for infiltration and may subsequently be removed, leaving a deposit of the particles which comprise a matrix 12 (at least in part) within the preform. Additional infiltration steps may be utilized to deposit additional particles that may be the same as or different from earlier deposited particles. The specific types and properties of the constituents within the preform 10 are typically selected in view of the desired CMC component being formed and the end-use properties thereof. Removal of the liquid carrier may result in some amount of residual porosity within the CMC preform. The liquid mixture may be aqueous or non-aqueous, where non-aqueous slurries may be comprised of organics that are completely removed or preceramic polymers that are converted during subsequent processing and the resulting ceramic 'char' retained as part of the matrix In some instances, the preform 10 may be infiltrated with a liquid mixture that includes a ceramic precursor. The preform may then be subjected to one or more thermal treatments to convert the one or more ceramic precursor constituents into a ceramic form, and/or to facilitate reactions between constituents to produce a desired material. The thermal treatments may produce voids, microcracks, gaps, or the like (referred to collectively as "voids"), that occur for example from the shrinkage of the ceramic precursor, sintering, or other factors. Such voids (e.g., that may be intra-bundle, or inter-bundle) can provide points of ingress for oxygen, moisture or other substances that can contribute to debiting the properties of the CMC component.

The present disclosure is not limited to use with any particular CMC preform 10. For example, the present disclosure is not limited to any particular CMC preform 10 configuration (e.g., fiber structure, open-pore foam or foam-like structure, or any other structures that has an internal porosity). The present disclosure is also not limited to use with CMC preforms 10 of any particular material or materials. On the contrary, the present disclosure may be utilized with any sort of composite structure, but in particular CMC preforms (e.g. Carbon ("C") fiber/C matrix, C fiber/Silicon Carbide ("SiC") matrix, SiC fiber/SiC matrix, Aluminum oxide (e.g., "$Al_2O_3$")/$Al_2O_3$, preforms that include SiOC, SiNC, ZrC, HOC, and/or other refractory fibers, glass fibers, etc.).

Figure 2:
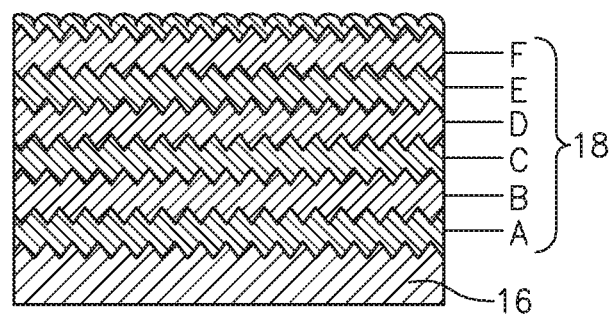
FIG. 2 is a diagrammatic illustration of a surface (e.g., on or within a preform) having multiple single layers (A-F) applied to the surface by an atomic layer deposition process.

Embodiments of the present disclosure include use of an atomic layer deposition (ALD) process at one or more points throughout the CMC component processing to improve the densification (e.g., decrease the porosity, number of voids, etc.) of the CMC preform 10 (and therefore the final CMC component) and/or to provide additional functionality. Various types of ALD processes exist and the specific type of ALD process may be selected based on several factors such as the surface material to be coated, the coating material, chemical interaction between the surface material and the coating material, etc. Non-limiting examples of ALD processes are provided below. The general principle for the various ALD processes comprises growing a thin film layer 18 by exposing a surface to be coated (e.g., a fiber surface, a fiber tow surface, etc.) to a plurality of sequential alternating pulses of gaseous chemical precursors that chemically react with the surface material one at a time in a self-limiting manner. ALD allows for a controlled self-limiting deposition of material through chemical reactions with the surface(s) of the preform 10. Aside from being a conformal process, ALD is also a uniform process. All exposed surfaces of the preform 10 will have the same or approximately the same amount of precursor material deposited. A typical reaction cycle of an ALD process starts with the preform 10 being enveloped with an environment of first precursor and chemisorption on all desired surfaces of the preform 10. The first precursor environment is then removed, and the preform 10 is then enveloped with a second precursor environment, which reacts with the first precursor chemisorbed on the surfaces of preform 10 and subsequently the second precursor environment is removed. This process may be repeated for a desired number of precursor applications. FIG. 2 is a diagrammatic illustration of a surface (e.g., on or within a preform) having multiple single layers 18 (A-F) applied to the surface 16 by an atomic layer deposition process. As stated above, the reaction (chemisorption) of the article surface 16 and the first chemical precursor creates a chemically bonded layer that is nominally one atomic layer thick. Excess material (e.g., chemical reaction byproducts) that may be created during the application and reaction with a first precursor may be removed with the excess precursor. A second precursor is introduced and reacts with the first precursor previously chemisorbed onto surface 16, resulting in a first layer 18A. The process may be repeated as many times as desired. In those embodiments that include multiple layers, the respective layers may comprise the same or different composition (e.g., based on the same or different precursors being used).

Figure 3:
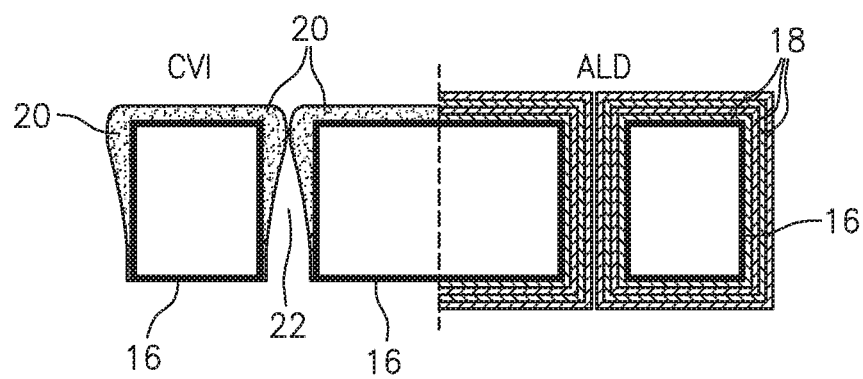
FIG. 3 is a diagrammatic illustration of elements within a preform (e.g., fibers, fiber bundles, etc.) having a coating of material applied by a time dependent or non-self-limiting deposition process (left side) and a plurality of coatings of material(s) applied by an atomic layer deposition process (right side).
Figure 4:
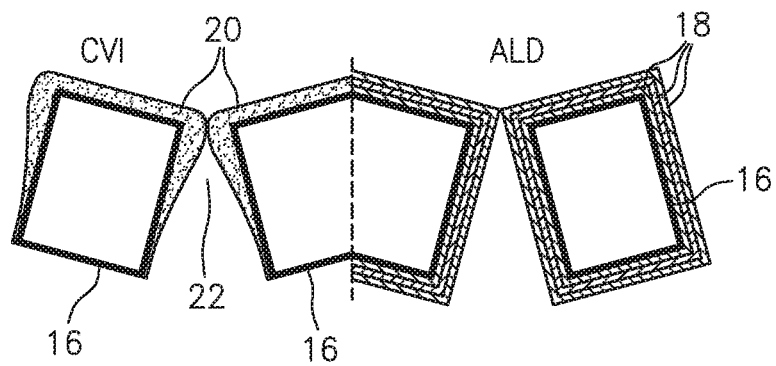
FIG. 4 is a diagrammatic illustration of elements within a preform (e.g., fibers, fiber bundles, etc.) having a coating of material applied by a time dependent or non-self-limiting deposition process (left side) and a plurality of coatings of material(s) applied by an atomic layer deposition process (right side).

Referring to FIGS. 3 and 4, unlike some deposition processes (e.g., chemical vapor deposition, "CVD", chemical vapor infiltration, "CVI"), the thickness of material grown using ALD is not dependent on deposition time per se. To be clear, deposition processes such as CVD and CVI (and others) are time dependent or non-self-limiting processes; i.e., the thickness of material deposited during the process increases as a function of the amount of time the process proceeds—the aforesaid process will not stop (therefore is not time limited) while the reactants are present. With PIP, the reactions are also time dependent or non-self-limiting in that the thickness of infiltrated material will increase with additional infiltration time until the preform porosity is completely infiltrated. With ALD, in contrast, the final thickness of material is dependent on the number of reaction cycles that are performed, because each reaction cycle will grow a layer 18 that is nominally one atomic layer thick. Hence, the ALD process provides a self-limiting, non-line-of-sight (NLOS) deposition of uniform, substantially pinhole-free, conformal coatings even on substrates with high aspect ratio (e.g. >1000:1) features. Some deposition processes (e.g., chemical vapor deposition, "CVD", chemical vapor infiltration, "CVI") that deposit material in a non-self-limiting manner—even those that are or can be tightly controlled operationally—can produce a non-uniform deposition of material 20 on surfaces 16 within the CMC preform 10 which negatively affects densification of the CMC preform 10. The non-uniform deposition may be the result of non-uniform gaseous infiltration due to physical characteristics of the CMC preform 10 impeding the aforesaid infiltration into interior regions, which may be exacerbated by material deposits completely or partially blocking passages 22 through which a precursor gas might otherwise enter. Since the reactions are not self-limiting, the local reaction rate and subsequent deposition will be higher, further exacerbating the non-uniform build-up of material and "canning-off". For example, CVI based CMCs typically do not include filler particles in the matrix because the filler particles may magnify the issue of "canning off"; i.e., the filler particles within the fiber structure tend to reduce the mean free path for gas flow and therefore the path for gaseous materials to be deposited. In addition, during a CVI process local "hot spots" (e.g., areas of increased reaction rate) often form and accentuate the issue of "canning off". The uniform, nominally single layer deposition produced by a self-limiting ALD process, in contrast, substantially reduces or avoids these issues where local reaction and deposition rates are higher and thereby provides a substantial improvement in densification.

Filler particles that may be present in the matrix may also be subject to an ALD process to adhere one or more precursor layers. In some embodiments, the preform CMC component may initially be subject to an ALD process to adhere one or more precursor layers to fill the smallest of voids of the preform, and thereby avoid "canning off" those minute voids. Subsequent to the ALD process, the preform CMC component may be subjected to a different deposition process (e.g., CVD, PIP, or CVI, etc.) that has a faster deposition rate. Subsequently, an ALD process may be applied again to fill voids that may otherwise be canned off if a deposition process other than ALD (with its uniform, single layer deposition) is utilized.

With ALD, each individual chemical reaction between a precursor and the surface may be referred to as a "half-reaction." During each half reaction, a precursor is pulsed onto the surface for a period of time sufficient to allow the precursor to fully react with the surface 16. The reaction is self-limiting as the precursor will react with a finite number of available reactive sites on the surface 16, forming a uniform continuous film layer 18 on the surface 16. Any sites that have already reacted with a precursor will become unavailable for further reaction with the same precursor unless and/or until the reacted sites are subjected to a treatment that will form new reactive sites on the uniform continuous coating; e.g., an introduction of a second different precursor able to react with the most recent uniform continuous film layer 18 grown on the surface 16. The reaction conditions are chosen to achieve the best combination of precursor adsorption and subsequent reaction, with typical growth per cycle in the range of one Angstrom. Compositions created using the ALD process can vary from metals to oxides and other ceramics, intermetallics, refractory compounds, multilayer structures, etc. In some embodiments, the compositions deposited within the preform can be chosen to add specific properties and/or functionality to the finally produced CMC. For example, the compositions created and deposited using an ALD can be chosen to provide enhanced oxidation resistance, thermal expansion control, moisture/humidity protection, corrosion resistance, enhanced matrix cracking for increasing proportional limit (i.e., improved mechanical strength of the matrix), etc.

The operational parameters of the ALD process may depend on the type of ALD process utilized, as well as factors specific to the CMC component being produced; e.g., the surface material to be coated, the coating material, chemical interaction between the surface material and the coating material, etc. The present disclosure is not, therefore, limited to any particular ALD operational parameters.

Figure 5:
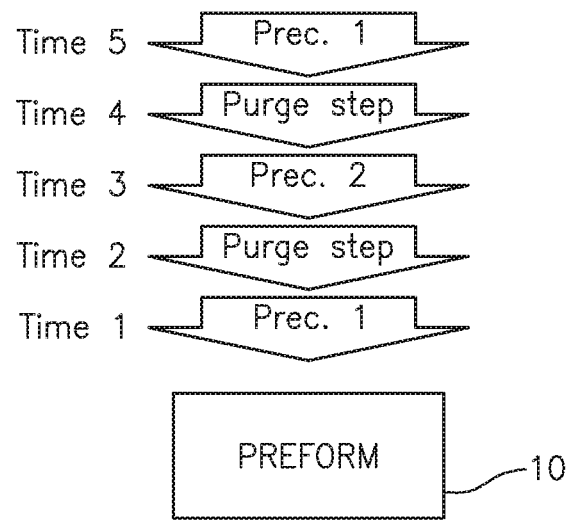
FIG. 5 is an exemplary diagram of a temporal atomic layer deposition process.

In some embodiments, the ALD process utilized within the present disclosure may be a "temporal ALD" process (e.g., see FIG. 5). In a temporal ALD process, the CMC preform may be disposed in an ALD vessel, and a first precursor may be introduced into the vessel for a period of time adequate for the reaction between the first precursor and the surface (e.g., a fiber surface, or a fiber bundle surface, or a particulate surface, etc.) to occur; i.e., an amount of time adequate for the first precursor to react with a finite number of available reactive sites on the surface, and form a uniform continuous film layer on the surface ("Time 1"). Subsequently, the ALD vessel is purged of the first precursor and any reaction byproducts between the first precursor and the CMC preform that may be created ("Time 2"). The process is then repeated with a second precursor being introduced into the vessel for a period of time adequate for the reaction between the second precursor and the surface (to which the first precursor is adsorbed) to occur ("Time 3"). Subsequently, the ALD vessel is purged of the second precursor and any reaction byproducts between the second precursor and the first precursor coating that made be created ("Time 4"). The process may be repeated numerous times until the desired deposition is completed.

Figure 6:
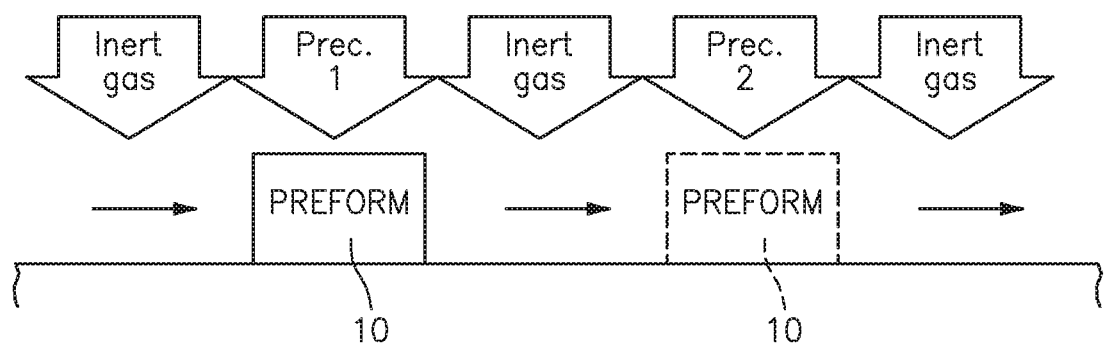
FIG. 6 is an exemplary diagram of a spatial atomic layer deposition process.

In some embodiments, the ALD process utilized within the present disclosure may be a "spatial ALD" process (e.g., see FIG. 6). In a spatial ALD process, the precursors are separated in space rather than in time. For example in a spatial ALD process, a CMC preform 10 may be passed through a vessel having a plurality of different precursor regions. The different precursor regions may, for example, be separated from one another by regions of inert gas. The inert gas regions prevent contamination (e.g., parasitic deposition) between the adjacent precursor regions. The spatial ALD process obviates the need for purge cycles between applications of different precursors, and thereby may decrease the ALD processing time for a CMC preform 10 under the present disclosure. The present disclosure is not, however, limited to either of these two ALD processes.

As stated above, an ALD process is a self-limiting, non-line of sight (NLOS) deposition process that produces a substantially uniform, pinhole-free, conformal coating even on substrates having features with a high aspect ratio (e.g. >1000:1). The reaction is self-limiting as the precursor will react with a finite number of available reactive sites on the surface, forming a uniform continuous film layer on the surface. In a CVD or CVI process (either of which can be used for deposition of material on a component surface) in contrast, the amount of material deposited is a function of deposition time. The longer the deposition time, the thicker the resultant film. Hence, a CVD or CVI process (and/or a PIP process of an MI process)—even if tightly controlled—is understood to present a greater potential for preform densification issues such as the sealing off fiber tows or pores, or the sealing off of other regions from a gaseous infiltration required for further densification. In particular, the utilization of an ALD process within the present disclosure may provide significant benefits for those preform CMC components that include high aspect ratio features. The single layer nature of an ALD process may permit a coating deposition in high aspect ratio regions (e.g., pores, microcracks, and other regions of the preform where the aspect ratio may be as high as or greater than 1000:1) not possible using other deposition processes, which improves the densification of preform.

Embodiments of the present disclosure include producing a CMC component in a hybrid manner; e.g., using a non-ALD coating deposition process as well as an ALD deposition process to provide a CMC component with improved densification characteristics over prior art methods—hybrid or single. For example, in some embodiments the constituents that are used to create a preform CMC component may be subjected to an ALD process prior to the preform CMC component being formed. For example as stated above, some CMC preforms may include fiber tows or bundles of fibers. In some embodiments, these fiber tows or bundles of fibers may be subject to an ALD process to adhere one or more precursor layers to ensure the presence of the precursor material even in the smallest of voids of the subsequently formed preform. Likewise, filler particles that may be present in the matrix may also be subject to an ALD process to adhere one or precursor layers. In some embodiments, the preform CMC component may initially be subject to an ALD process to adhere one or more precursor layers to fill the smallest of voids of the preform, and thereby reduce or avoid "canning off" those minute voids. Subsequent to the ALD process, the preform CMC component may be subjected to a different deposition process (e.g., CVD, PIP, or CVI, etc.) that has a faster deposition rate. Subsequently, an ALD process may be applied again to fill voids (e.g., created during the non-ALD deposition process) that may otherwise be canned off if a deposition process other than ALD (with its uniform, single layer deposition) is utilized. The particular combination of deposition processes (e.g., ALD, CVI, CVD, PIP, etc.) and the order in which they are applied (i.e., the hybrid methodology) may be varied to suit the application at hand; e.g., selected with the characteristics of the preform materials, type of preform, geometry of the preform, etc. in mind. The present disclosure is not limited to any particular combination and/or order of deposition processes, other than including one or more ALD deposition steps.

To illustrate at least some of the utility provided by the present disclosure, the following examples of hybrid processing are provided below. These examples are intended to be illustrative only, and the present disclosure in not limited thereto.

Example 1

The method for producing a CMC component includes creating a preform 10 (e.g., a fiber structure 11, or open-pore foam, or a foam-like structure, etc.) and subjecting the preform to a liquid mixture (e.g., a "slurry cast") having one or more types of matrix particles. Subsequent to the particles being deposited within the voids within the preform (which may involve removal of a fluid carrier), the densification of the preform may be completed by repeated ALD steps, each producing a deposition layer. The deposition layers (e.g., similar to layers 18A-F shown in FIG. 2) may each be the same material, or the layers may vary in material.

Example 2

The method for producing a CMC component includes creating a preform 10 (e.g., a fiber structure 11, or open-pore foam, or a foam-like structure, etc.), and subsequently filling some amount of the voids (e.g., the inter-fiber porosity) using an ALD process to deposit one or more layers. Next, the preform 10 may be subjected to a liquid mixture (e.g., a "slurry cast") having one or more types of matrix particles to fill the larger remaining porosity within the preform 10 (e.g., in more open areas of a woven fabric, in between plies, etc.). Next, an ALD process may be used to complete the densification of the preform. In this example (and others), each of the plurality of ALD applied materials may be the same, or may be different; e.g., a first ALD step applies a first material, and a second ALD step applies a second material, etc. In those instances where an ALD process is used to densify/create outer layers of the preform, the latter ALD process steps may apply a material that has enhanced refractory or oxidation resistant characteristics.

Example 3

In some instances, it may be desirable to produce a CMC component using a MI and/or a PIP process to produce at least a portion of the CMC matrix. In these instances, it is typically beneficial to have as much matrix filler as possible to reduce the amount of "infiltrated" matrix (e.g., silicon metal for melt infiltration, or polymer derived ceramic for PIP) as the inherent disadvantages of the respective MI and PIP processes tend to scale with the amount of infiltrated matrix; i.e., residual Si metal in MI processed materials may limit the use temperature of the formed CMC component, and polymer derived ceramics often contain significant microcracking that forms upon pyrolysis (conversion from polymer to ceramic). MI materials are typically formed by molten silicon infiltration of either a slurry cast preform (e.g. preform previously filled with one or more matrix particulates) or a tape layup (as described above). In this example and with respect to MI, therefore, the method for producing a CMC component may include creating a preform 10 (e.g., a fiber structure 11, or open-pore foam, or a foam-like structure, etc.), and subjecting the preform 10 to an ALD process to deposit one or more material layers. Next, the preform 10 may be slurry cast to fill voids therein with particulate. Implementing one or more ALD processes prior to (and after in some instances) the slurry cast step may enhance the filling of the slurry cast preform (i.e., fill voids present in the preform before the slurry cast step, and voids remaining after the slurry cast step; e.g., to avoid "canning off"). The preform 10 may then be subject to a MI process. In addition to the benefits an ALD process can provide for enhanced void ("pore") filling, the ALD process steps could also be tailored to deposit a material that a) enhances Si wetting during the infiltration process (i.e., during the slurry cast step), b) may react with the Si during infiltration (e.g. to form another compound to reduce residual free silicon), and c) may otherwise enhance the durability of the CMC composite (e.g. enhancing the interface between the particulate and surrounding matrix could enable enhanced crack deflection or toughness of the matrix as well as thermal conductivity).

In this example with respect to PIP, the method for producing a CMC component may include creating a preform 10 (e.g., a fiber structure 11, or open-pore foam, or a foam-like structure, etc.), and subjecting the preform 10 to an ALD process to deposit one or more material layers. Next, the preform 10 may be slurry cast to fill voids. In the PIP process, the slurry may be a polymer precursor to a ceramic, so significant ceramic 'char' will remain after the process, accompanied by significant shrinkage (e.g., typically manifested as microcracking). In the PIP process, repeated infiltrations may be performed. Sometimes, these PIP infiltrations use resins filled with particulates, but often the infiltrations use a "neat" (i.e. unfilled) resin. Implementing one or more ALD processes prior to a PIP slurry cast step, or after a PIP slurry cast step (and also in some instances between PIP slurry casts steps), may enhance the filling of the preform (i.e., fill voids present in the preform before the PIP step, and voids present after the PIP step; e.g., to avoid "canning off"). In addition to the benefits an ALD process can provide for enhanced void ("pore") filling, the ALD process steps in combination with the PIP steps could also be tailored to deposit a material that enhances the durability of the CMC composite, and/or other material characteristics of the CMC component material; e.g., refractory, oxidation resistant, etc.).

As used in this specification and the appended claims, the singular forms "a," "an," and "the" include plural forms thereof unless the context clearly indicates otherwise. Unless otherwise indicated, all numbers expressing conditions, concentrations, dimensions, and so forth used in the specification and claims are to be understood as being modified in all instances by the term "about".

Where methods and steps described above indicate certain events occurring in certain order, those of ordinary skill in the art will recognize that the ordering of certain steps may be modified and that such modifications are in accordance with the variations of the invention. Additionally, certain steps may be performed concurrently in a parallel process when possible, as well as performed sequentially. Therefore, the particular order of the steps set forth in the description should not be construed as a limitation.

While various embodiments of the present disclosure have been disclosed, it will be apparent to those of ordinary skill in the art that many more embodiments and implementations are possible within the scope of the present disclosure. For example, the present disclosure as described herein includes several aspects and embodiments that include particular features. Although these features may be described individually, it is within the scope of the present disclosure that some or all of these features may be combined with any one of the aspects and remain within the scope of the present disclosure. Accordingly, the present disclosure is not to be restricted except in light of the attached claims and their equivalents.

What is claimed is:

1. A method of producing a ceramic matrix composite material component, comprising:
   producing a preform having a ceramic matrix material interspersed within a fiber structure by subjecting the fiber structure, comprising one or more fibrous bundles, to a slurry including ceramic matrix particles, the one or more fibrous bundles having an intra-bundle porosity such that the preform is porous with internal voids;

applying at least one layer of a first material to the ceramic matrix material of the preform using an atomic layer deposition (ALD) process, subsequent to the step of producing the preform having the ceramic matrix material interspersed within the fiber structure by subjecting the fiber structure to the slurry, to decrease a porosity of the preform by decreasing the intra-bundle porosity of the one or more fibrous bundles;

applying one or more layers of a second material to the preform, subsequent to the ALD process, using a deposition process that deposits the second material in a non-self-limiting process comprising at least one of a chemical vapor infiltration process, a chemical vapor deposition process, or a polymer infiltration and pyrolysis process; and applying at least one layer of a third material to the preform using said ALD process, subsequent to the step of applying the one or more layers of the second material to the preform using the deposition process, to decrease the porosity of the preform by filling voids created during the deposition process, wherein the ceramic matrix material includes one or more ceramic precursor constituents, the method further comprising applying one or more thermal treatments to the preform subsequent to the step of producing the preform and before the step of applying the at least one layer of the first material to the preform using the ALD process, wherein applying the one or more thermal treatments to the preform converts the one or more ceramic precursor constituents into a ceramic form.

2. A method of producing a ceramic matrix composite (CMC) component, comprising:

providing a preform having a ceramic matrix material interspersed within a fiber structure, the fiber structure including one or more fibrous bundles having an intra-bundle porosity such that the preform is porous with internal voids;

applying at least one layer of a first material to the ceramic matrix material of the preform, subsequent to the step of providing the preform having the ceramic matrix material interspersed within the fiber structure, wherein the at least one layer of a first material is applied using an atomic layer deposition (ALD) process to decrease a porosity of the preform;

applying one or more layers of a second material to the preform after the at least one layer of the first material is applied, using a deposition process that deposits the second material in a non-self-limiting process comprising at least one of a chemical vapor infiltration process, a chemical vapor deposition process, or a polymer infiltration and pyrolysis process; and applying at least one layer of a third material to the preform using said ALD process, wherein the at least one layer of the third material is applied to the preform after the one or more layers of the second material are applied to the preform, wherein the ceramic matrix material includes one or more ceramic precursor constituents, the method further comprising applying one or more thermal treatments to the preform subsequent to the step of providing the preform and before the step of applying the at least one layer of the first material to the preform using the ALD process, wherein applying the one or more thermal treatments to the preform converts the one or more ceramic precursor constituents into a ceramic form.

* * * * *